(12) United States Patent
Chiu

(10) Patent No.: US 11,315,918 B2
(45) Date of Patent: Apr. 26, 2022

(54) SEMICONDUCTOR STRUCTURE AND SEMICONDUCTOR LAYOUT STRUCTURE

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 22 days.

(21) Appl. No.: 16/865,429

(22) Filed: May 4, 2020

(65) Prior Publication Data

US 2021/0343695 A1 Nov. 4, 2021

(51) Int. Cl.
| | |
|---|---|
| *H01L 27/02* | (2006.01) |
| *H01L 27/112* | (2006.01) |
| *H01L 23/528* | (2006.01) |
| *H01L 23/525* | (2006.01) |
| *H01L 23/522* | (2006.01) |

(52) U.S. Cl.
CPC ........ *H01L 27/0207* (2013.01); *H01L 23/528* (2013.01); *H01L 23/5226* (2013.01); *H01L 23/5256* (2013.01); *H01L 27/11206* (2013.01)

(58) Field of Classification Search
CPC ........... H01L 27/0207; H01L 27/11206; H01L 23/5226; H01L 23/5256; H01L 23/528; H01L 29/682; H01L 29/8615
See application file for complete search history.

(56) References Cited

U.S. PATENT DOCUMENTS

| | | | | |
|---|---|---|---|---|
| 6,512,263 B1 * | 1/2003 | Yuan | ................. | H01L 27/11524 257/316 |
| 2002/0160581 A1 * | 10/2002 | Watanabe | ............. | H01L 21/763 438/430 |
| 2005/0013163 A1 * | 1/2005 | Ferrant | ................. | G11C 11/404 365/185.01 |
| 2011/0260230 A1 * | 10/2011 | Lee | ................... | H01L 29/66666 257/306 |
| 2012/0008364 A1 * | 1/2012 | Lai | ......................... | G11C 17/16 257/E21.409 |
| 2012/0261733 A1 * | 10/2012 | Oyu | .................. | H01L 27/10885 257/296 |

(Continued)

FOREIGN PATENT DOCUMENTS

| | | |
|---|---|---|
| TW | 201203253 A | 1/2012 |
| TW | I483347 B | 5/2015 |

*Primary Examiner* — Galina G Yushina
(74) *Attorney, Agent, or Firm* — CKC & Partners Co., LLC

(57) ABSTRACT

A semiconductor layout structure includes a substrate, a plurality of gate structures, and a plurality of conductive structures. The substrate includes a plurality of active regions extending along a first direction, in which the active regions are separated from each other by an isolation structure. The transistors are respectively disposed in the active regions. The gate structures extend across the active regions along a second direction that is perpendicular to the first direction, in which each of the active regions includes a pair of source/drain portions at opposite sides of each of the gate structures. The conductive structures are embedded in a first portion of the isolation structure disposed between the adjacent active regions in the first direction, wherein the conductive structures extend along the second direction and are separated from the source/drain portions by the isolation structure.

15 Claims, 4 Drawing Sheets

(56) References Cited

U.S. PATENT DOCUMENTS

2014/0332749 A1* 11/2014 Yokoyama ............ H01L 21/845
257/4
2018/0233451 A1* 8/2018 Chang ............... H01L 27/10894

* cited by examiner

SEMICONDUCTOR STRUCTURE AND SEMICONDUCTOR LAYOUT STRUCTURE

BACKGROUND

Field of Invention

The present invention relates to a semiconductor structure and semiconductor layout structure. More particularly, the present invention relates to a semiconductor structure and semiconductor layout structure with anti-fuse structures.

Description of Related Art

Fuse elements are commonly used in semiconductor devices, such as semiconductor memory or logic devices. Anti-fuses have electrical characteristics opposite to those of fuses and may be used for the repair of defective cells by swapping the defective cells with redundant cells.

In general, one anti-fuse needs to be controlled by one control gate adjacent thereof. Therefore, a unit cell is defined as 1T1C, which refers to one transistor (control gate) and one capacitance (anti-fuse). However, when the number of anti-fuse is increasing, the conventional of 1T1C structure will occupy a big area. In order to achieve a high density memory cell or redundancy, the unit cell should be as small as possible.

SUMMARY

In accordance with an aspect of the present disclosure, a semiconductor layout structure is provided. The semiconductor layout structure includes a substrate, a plurality of gate structures, and a plurality of conductive structures. The substrate includes a plurality of active regions extending along a first direction, in which the active regions are separated from each other by an isolation structure. The gate structures extend across the active regions along a second direction that is perpendicular to the first direction, in which each of the active regions includes a pair of source/drain portions at opposite sides of each of the gate structures. The conductive structures are embedded in a first portion of the isolation structure disposed between the adjacent active regions in the first direction, in which the conductive structures extend along the second direction and are separated from the source/drain portions by the isolation structure.

According to some embodiments of the present disclosure, the first portion of the isolation structure includes a lower isolation structure and an upper isolation structure. The lower isolation structure is interposed between the active regions. The upper isolation structure is disposed on the lower isolation structure and extends into the active regions on opposite sides of the first portion of the isolation structure along the first direction.

According to some embodiments of the present disclosure, the conductive structures have a portion of a sidewall covered by the upper isolation structure.

According to some embodiments of the present disclosure, the first portion of the isolation structure has a width that is greater than a width of the conductive structures in the first direction.

According to some embodiments of the present disclosure, the isolation structure further includes a second portion interposed between the active regions in the second direction.

According to some embodiments of the present disclosure, a first gate structure and a second gate structure are disposed on each of the active regions, and each of the active regions has a common source/drain portions shared by the first gate structure and the second gate structure.

According to some embodiments of the present disclosure, the semiconductor layout structure further includes a plurality of contact plugs respectively connected to the conductive structures, the source/drain portions, and the gate structures.

According to some embodiments of the present disclosure, the semiconductor layout structure further includes a plurality of connected lines extending along the first direction and connected to the gate structures via the contact plugs.

In accordance with another aspect of the present disclosure, a semiconductor structure is provided. The semiconductor structure includes a substrate, a first transistor and a second transistor, an isolation structure and an isolation structure. The substrate has a first active region and a second active region spaced from each other. The first transistor and the second transistor are respectively disposed in the first active region and the second active region. The isolation structure is interposed between the first transistor and the second transistor, in which the isolation structure has a protruding portion laterally extends into the first active region and the second active region. The conductive structure is embedded in the isolation structure, in which the conductive structure is separated from the first transistor and the second transistor by the protruding portion of the isolation structure.

According to some embodiments of the present disclosure, the conductive structure has a portion of a sidewall covered by the protruding portion of the isolation structure.

According to some embodiments of the present disclosure, the isolation structure has a width that is greater than a width of the conductive structure.

According to some embodiments of the present disclosure, each of the first transistor and the second transistor includes a gate structure on the substrate, and a pair of source/drain portions in the substrate.

According to some embodiments of the present disclosure, the source/drain portions have a bottom surface that is below a bottom surface of the conductive structure.

According to some embodiments of the present disclosure, the protruding portion of the isolation structure has a top surface that is level with a top surface of the source/drain portions.

According to some embodiments of the present disclosure, further includes a plurality of contact plugs respectively connected to the conductive structure, one of the source/drain portions away from the conductive structure, and the gate structure.

According to some embodiments of the present disclosure, the semiconductor structure further includes a connected line coupled to the gate structure.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not

DETAILED DESCRIPTION

Figure 1:
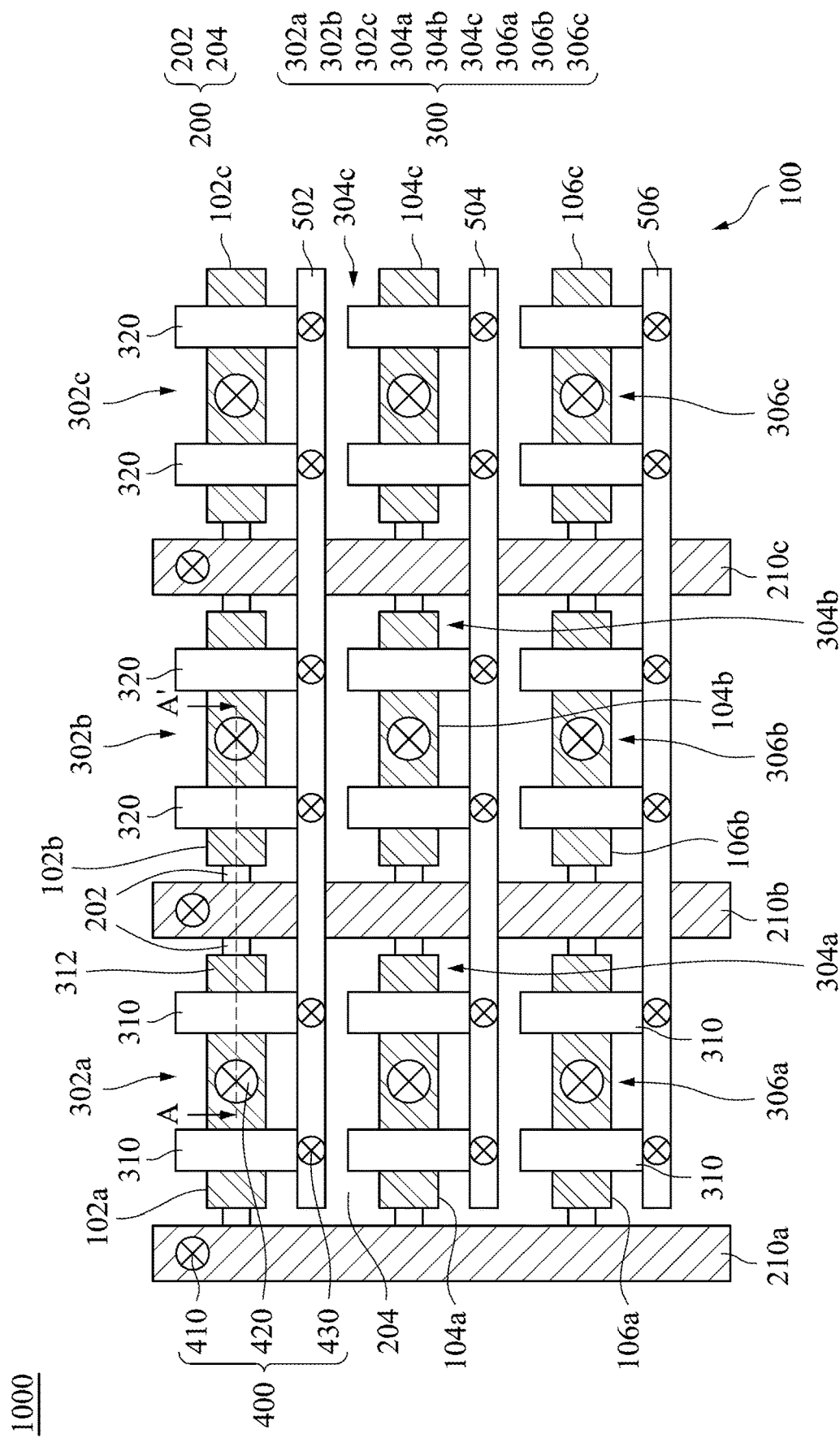
FIG. 1 is a top view illustrating semiconductor layout structure according to some embodiments of the present disclosure.

Specific embodiments of the components and arrangements described below are intended to simplify the present disclosure. Of course, these are merely embodiments and are not intended to limit the present disclosure. For example, forming a first feature above or on a second feature in the subsequent description may include an embodiment in which the first feature and the second feature are formed as in direct contact, or include an embodiment in which an additional feature is formed between the first feature and the second feature such that the first feature and the second feature are not in direct contact. Additionally, component symbols and/or letters may be repeated in various embodiments of the present disclosure. This repetition is for the purpose of simplicity and clarity, and does not in itself indicate the relationship between the various embodiments and/or configurations discussed.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

FIG. 1 is a top view illustrating a semiconductor layout structure 1000 according to some embodiments of the present disclosure. Reference is made to FIG. 1. The semiconductor layout structure 1000 includes a substrate 100, a plurality of transistors 300, and a plurality of conductive structures 210a, 210b and 210c. The semiconductor layout structure 1000 may optionally include other elements, which are described hereinafter.

The substrate 100 includes a plurality of active regions (such as active regions 102a, 102b, 102c, 104a, 104b, 104c, 106a, 106b and 106c) extending along a first direction D1, and the active regions are separated from each other by an isolation structure 200. For example, each of the active regions 102a, 102b, 102c, 104a, 104b, 104c, 106a, 106b and 106c extends lengthwise along the first direction D1. The active regions 102a, 102b and 102c are separated from each of the in the first direction D1. The active regions 102a, 104a and 106a, for example, are parallel and separated from each other in a second direction D2 that is perpendicular to the first direction D1. In some embodiments, the substrate 100 may be a single crystal semiconductor substrate or a polycrystalline semiconductor substrate made of silicon or silicon carbide, a compound semiconductor substrate made of silicon germanium or the like, a silicon on insulator (SOI) substrate, or the like. It is understood that the number, the dimension and the arrangement of the active regions can be changed, depending on the need.

The transistors 300 may include transistor 302a, 302b, 302c, 304a, 304b, 304c, 306a, 306b and 306c respectively disposed in the active regions 102a, 102b, 102c, 104a, 104b, 104c, 106a, 106b and 106c, as illustrated in FIG. 1. In some embodiments, the transistors 300 are respectively disposed in a p-well region (not shown) of the substrate 100. For example, the transistor 302a includes a gate structure 310 and a pair of source/drain portions 312. The gate structure 310 is disposed on the substrate 100 and extending across the active region 102a along a second direction D2 that is perpendicular to the first direction D1. In some embodiments, the gate structure 310 includes polysilicon, a metal such as aluminum (Al), copper (Cu), or tungsten (W), other conductive materials, or combinations thereof. The source/drain portions 312 are disposed at opposite sides of each of the gate structure 310. In some embodiments, the source/drain portions 312 are doped with N-type dopants such as phosphorus or arsenic.

In some embodiments, a first gate structure (the gate structure 310 adjacent to the conductive structure 210b) and a second gate structure (the gate structure 310 adjacent to the conductive structure 210a) are disposed on each of the active regions (e.g. the active region 102a). As shown in FIG. 1, two gate structures 310 cross the active region 102a along the second direction D2. The source/drain portions 312 are disposed on both sides of the gate structures 310. Therefore, the active region 102a has a common source/drain portion 312 (i.e., the source/drain portion 312 between the gate structures 310) shared by the gate structures 310. The material and the structure of other transistors (e.g., transistors 302b, 302c, 304a, 304b, 304c, 306a, 306b and 306c shown in FIG. 1) may be the same as that of transistor 302a, and will not be repeated hereinafter.

The isolation structure 200 electrically insulates the active regions. As shown in FIG. 1, the isolation structure 200 may include a first portion 202 and a second portion 204 respectively extending along the first direction D1 and the second direction D2. For example, the first portions 202 are respectively interposed between the active regions 102a, 102b and 102c to separate theses active regions in the first direction D1. The second portions 204 of the isolation structure 200 are respectively interposed between the active regions 102a, 104a and 106a to separate theses active regions in the second direction D2. In some embodiments, the isolation structure 200 is shallow trench isolation (STI). In some embodiments, the isolation structure 200 includes silicon oxide, silicon nitride, silicon oxy-nitride, tetraethoxysilane (TEOS), or fluoride-doped silicate (FSG). In some embodiments, the material of the first portion 202 is same as that of the second portion 204. In other embodiments, the material of the second portion 204 is different from that of the second portion 204.

The conductive structures (such as conductive structures 210a, 210b and 210c) are embedded in the first portion 202 of the isolation structure 200 and extend along the second direction D2. For example, the conductive structure 210b passes the active regions 102a, 102b, 104a, 104b, 106a and 106b. In some embodiments, the conductive structures 210a, 210b and 210c include conductive material, such as polysilicon, metal, metal alloys, other suitable materials, and/or combinations thereof.

The semiconductor layout structure 1000 may further includes a plurality of contact plugs 400 respectively connected to the conductive structures 210a, 210b and 210c, the source/drain portions 312, 322 and 332 and the gate structures 310, 320 and 330. Specifically, the contact plugs 410 are respectively coupled to the conductive structures 210a, 210b and 210c. The contact plugs 420 are respectively coupled to the source/drain portions 312, 322 and 332 which are between the gate structures 310, gate structures 320 and gate structures 330, for example. The contact plugs 430 are coupled to the gate structures 310, 320 and 330. In some embodiments, the contact plugs 400 include conductive material, such as polysilicon, metal, metal alloys, other suitable materials, and/or combinations thereof.

In some embodiments, the semiconductor layout structure 1000 further includes a plurality of connected lines 502, 504 and 506 extending along the first direction D1, as illustrated in FIG. 1. The connected lines 502, 504 and 506 may respectively pass the active regions 102a, 102b and 102c, the active regions 104a, 104b and 104c, and the active regions 106a, 106b and 106c. Specifically, the connected line 502 is connect to the gate structures 310, 320 and 330 in the active regions 102a, 102b and 102c via the contact plugs 430. The connected line 504 is connected to the gate structures 310, 320 and 330 in the active regions 104a, 104b and 104c via the contact plugs 430. Similarly, the connected line 506 is connected to the gate structures 310, 320 and 330 in the active regions 106a, 106b and 106c via the contact plugs 430. In some embodiments, the connected lines 502, 504 and 506 include conductive material, such as polysilicon, metal, metal alloys, other suitable materials, and/or combinations thereof.

Figure 2:
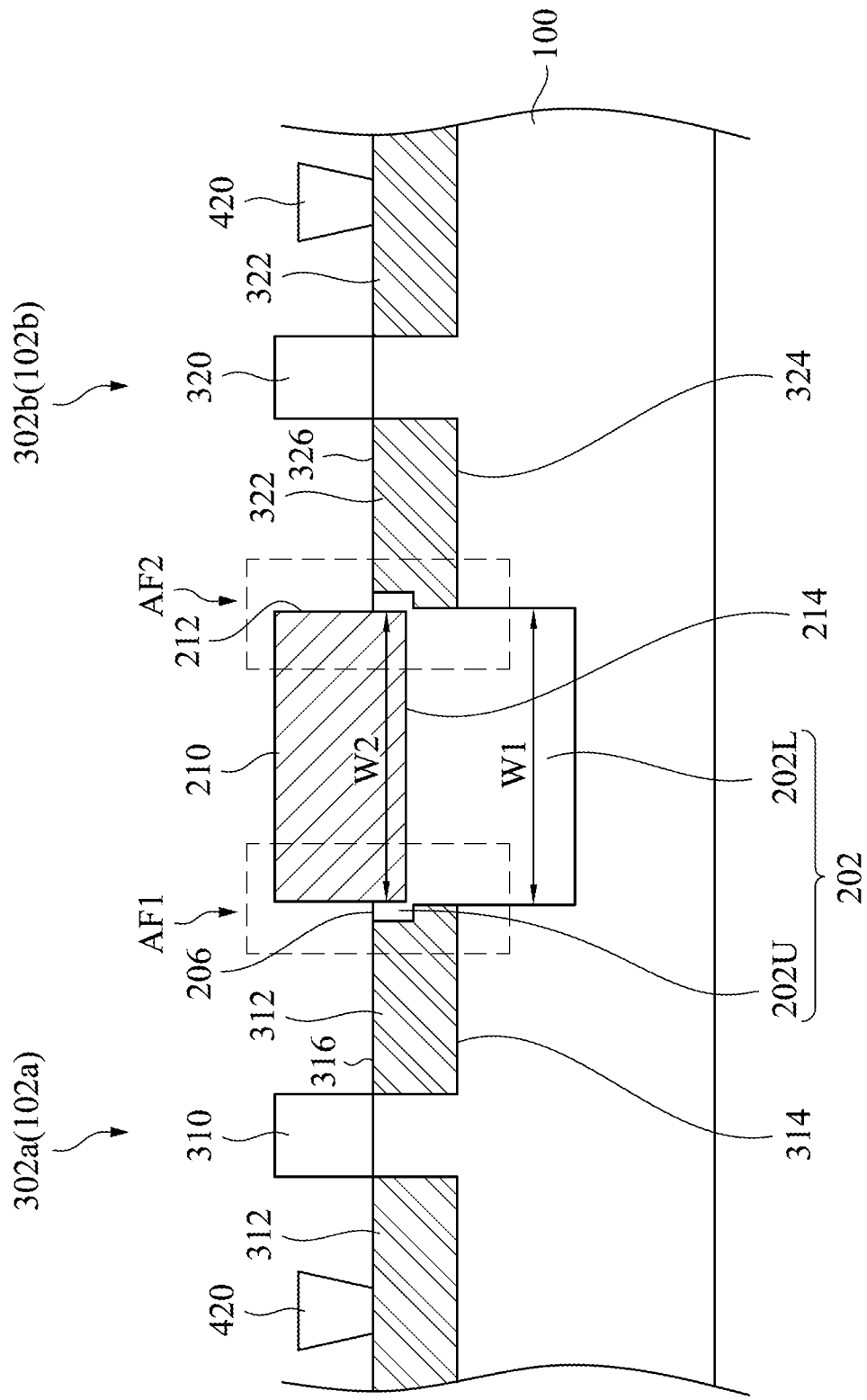
FIG. 2 is a cross-sectional view taken along the line A-A' of FIG. 1 according to some embodiments of the present disclosure.

FIG. 2 is a cross-sectional view taken along the line A-A' of FIG. 1 according to some embodiments of the present disclosure. Reference is made to FIG. 2. The substrate 100 includes the active regions 102a and 102b spaced apart from each other. The transistors 302a and 302b are respectively disposed in the active regions 102a and 102b. The transistor 302a includes the gate structure 310 and a pair of source/drain portions 312. Similarly, the transistor 302b includes the gate structure 320 and a pair of source/drain portions 322. In some embodiments, each of the gate structures 310 and 320 includes a gate electrode on the substrate 100 and one or more gate dielectric layer (not shown) disposed between the gate electrode and the substrate 100.

The first portion 202 of the isolation structure 200 is interposed between the transistor 302a and 302b. The first portion 202 of the isolation structure 200 includes a lower isolation structure 202L and an upper isolation structure 200U thereon. Specifically, the lower isolation structure 202L is interposed between the active regions 102a and 102b, and the upper isolation structure 200U is disposed on the lower isolation structure 202L and extends into the active regions 102a and 102b on opposite sides of the first portion 202 of the isolation structure 200. Accordingly, the upper isolation structure 202U laterally protrudes from a sidewall of the lower isolation structure 202L to the active regions 102a and 102b along the second direction D2. In some embodiments, the upper isolation structure 202U of the isolation structure 200 has a top surface 206 that is level with top surfaces 316 and 326 of the source/drain portions 312 and 322. In some embodiments, the source/drain portions 312 and 322 respectively has a top surface 316 and a top surface 326 that is level with a top surface 206 of the upper isolation structure 202U of the isolation structure 200. As shown in FIG. 2, the conductive structure 210b is interposed between the active regions 102a and 102b and separated from the adjacent source/drain portions 312 and 322 by the upper isolation structure 202U. In some embodiments, a bottom surface 214 of the conductive structure 210b is below the bottom surfaces 314 and 324 of the source/drain portions 312 and 322. That is, the conductive structure 210b has a portion of a sidewall 212 covered by the upper isolation structure 202U of the isolation structure 200. In some embodiments, a width W1 of the first portion 202 of the isolation structure 200 is greater than a width W2 of the conductive structure 210b. The structure of the other conductive structure (e.g., conductive structures 210a and 210c) may be the same as the conductive structure 210b, and will not be repeated hereinafter.

The contact plugs 420 are respectively formed on the source/drain portions 312 and 322 away from the first portion 202 of the isolation structure 200. In some embodiments, the contact plugs 420 may penetrate an interlayer dielectric layer (not shown) covered on the transistors 302a, 302b and the conductive structure 210b to couple with the source/drain portions 312 and 322.

As shown in FIG. 2, a pair of anti-fuse structures AF1 and AF2 is formed between the active regions 102a and 102b. The conductive structure 210b is functioned as a top plate of the anti-fuse structures AF1 and AF2. The source/drain portions 312 and 322 are respectively functioned as a bottom plate of the anti-fuse structures AF1 and AF2. The upper isolation structure 202U of the isolation structure 200 is functioned as a dielectric layer between the top plate and the bottom plate of the anti-fuse structures AF1 and AF2. Specifically, the anti-fuse structure AF1 includes the conductive structure 210b, the upper isolation structure 202U and the source/drain portion 312 which is shared with the transistor 302a. Similarly, the anti-fuse structure AF2 includes the conductive structure 210b, the upper isolation structure 202U and the source/drain portion 322 which is shared with the transistor 302b. Other anti-fuse structures may be formed between the other active regions. For example, another pair of anti-fuse structure may be formed between the active regions 104a and 104b (shown in FIG. 1), and the conductive structure 210b and the upper isolation structure 202U may also be functioned as a top plate and a dielectric layer, respectively.

Figure 3:
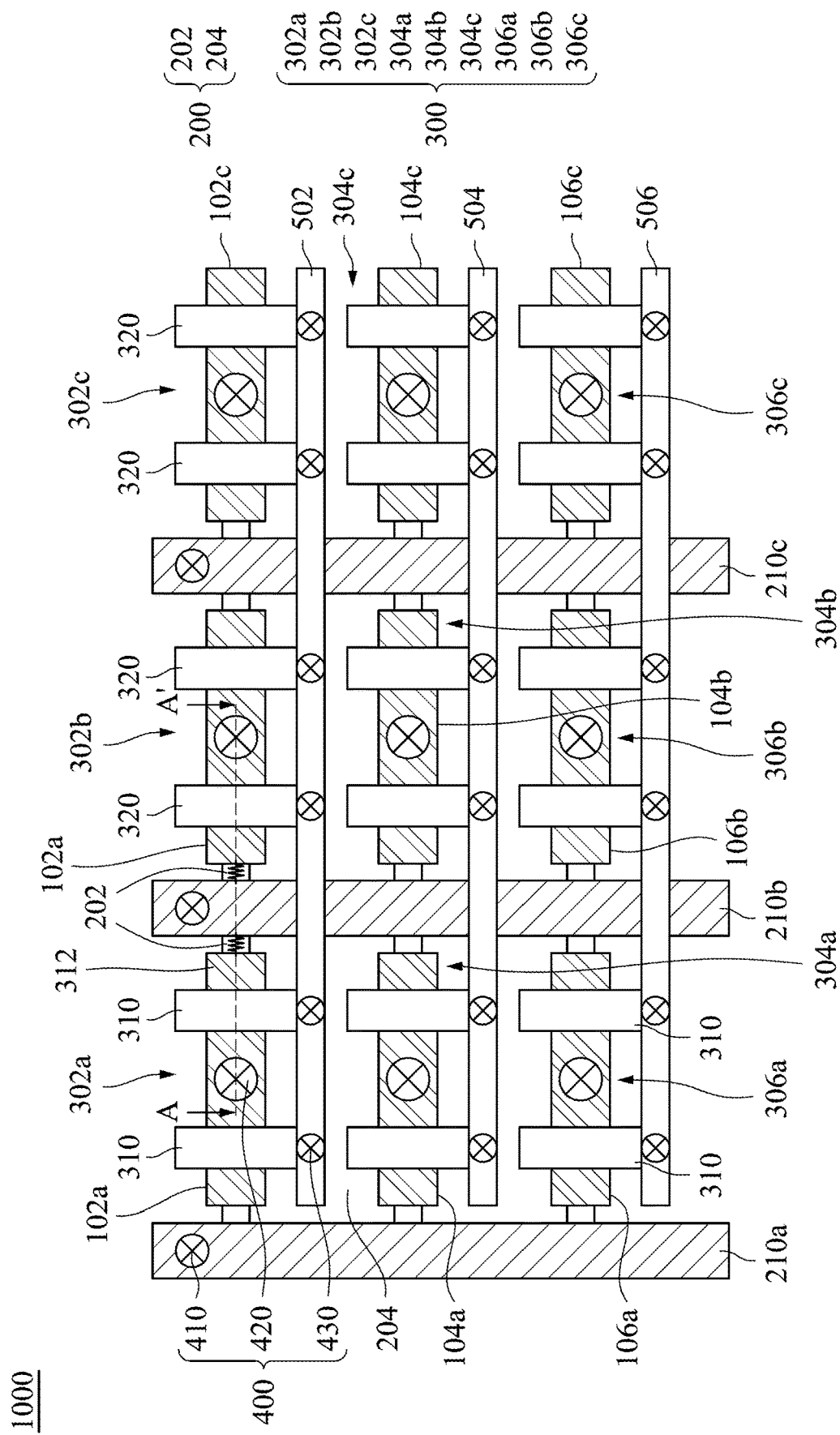
FIG. 3 is a top view illustrating semiconductor layout structure having a pair of blown out anti-fuse structures according to some embodiments of the present disclosure.
Figure 4:
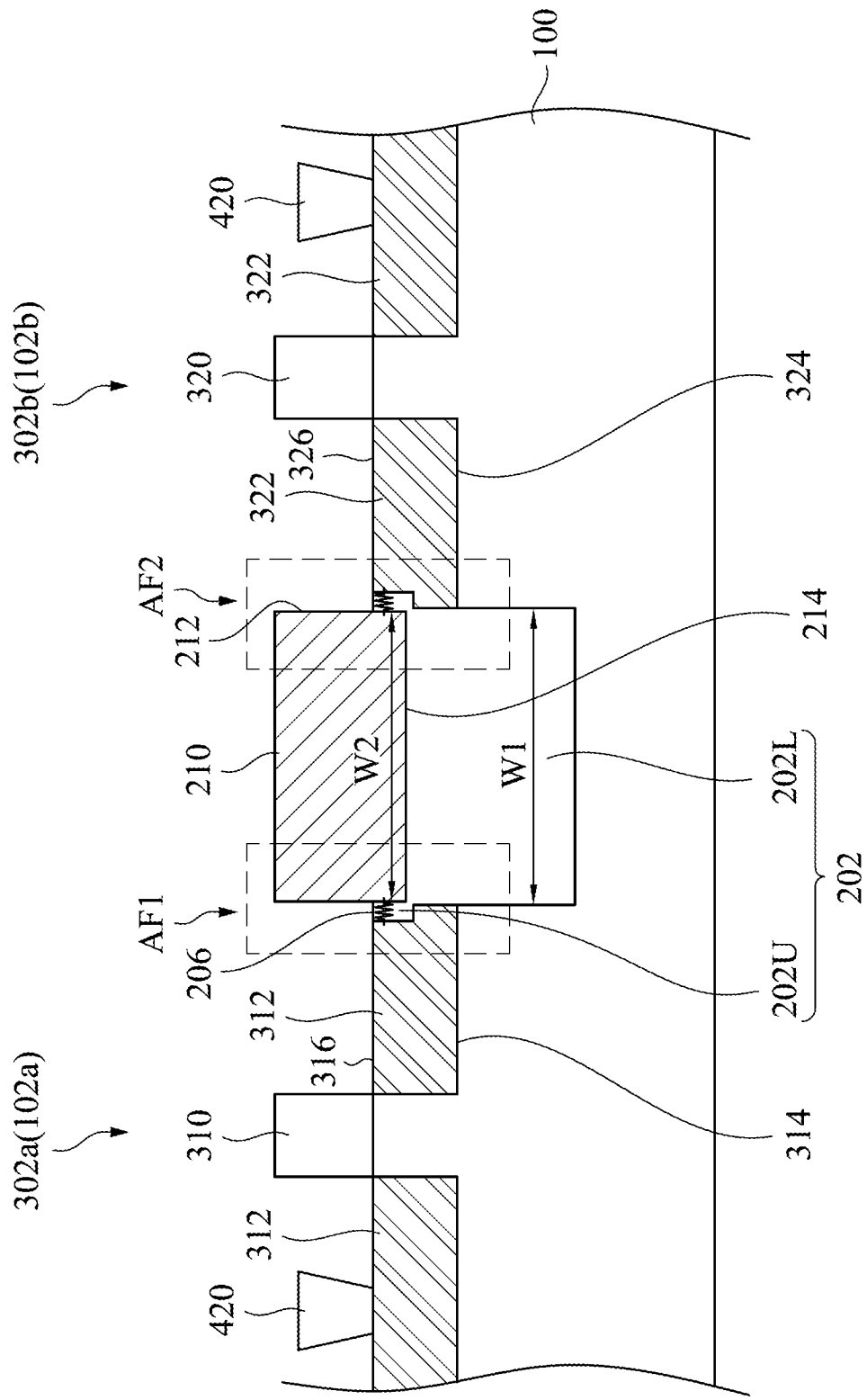
FIG. 4 is a cross-sectional view taken along the line A-A' of FIG. 3 according to some embodiments of the present disclosure.

FIG. 3 is a top view illustrating semiconductor layout structure 1000 having a pair of blown out anti-fuse structures AF1 and AF2 according to some embodiments of the present disclosure. FIG. 4 is a cross-sectional view taken along the line A-A' of FIG. 3 according to some embodiments of the present disclosure.

Reference is made to FIG. 3. During blowing out the anti-fuse structures AF1 and AF2 shown in FIG. 2, a voltage (e.g., 1V) is applied to the connected line 502 to select the transistors 302a, 302b and 302c, a voltage (e.g., 6V) is applied to the conductive structure 210b, and the source/drain portion 312 between the gate structures 310 and the source/drain portion 322 between the gate structures 320 are grounded via the contact plugs 420. Therefore, as illustrated in FIG. 4, the dielectric layer (i.e., the upper isolation structure 202U) is ruptured by a voltage difference (e.g., 6V) between both ends of the anti-fuses AF1 and AF2 (i.e., the source/drain portions 312 and 322 and the conductive structure 210). As such, anti-fuses AF1 and AF2 are breakdown and turned into low-resistance, whereas other anti-fuse structures which are not selected in the semiconductor layout structure 1000 maintain high-resistance. That is, for example, the upper isolation structure 202U between the conductive structures 210c and the active regions 102b and 102c in the semiconductor layout structure 1000 are not been ruptured. The pair of anti-fuse structures AF1 and AF2 can be blown out at the same time and generate electrically conductive path, which increase the blowing out efficiency.

As described above, according to the embodiments of the present disclosure, a semiconductor layout structure is provided. In the semiconductor layout structure of the present disclosure, an isolation structure separates a plurality of active regions. A plurality of transistors is respectively disposed in the active regions, and a pair of anti-fuse structure is disposed between the adjacent active regions. Specifically, a bottom plate of each of the anti-fuse structures is a source/drain portion of the adjacent transistors. That is, the transistor shares one source/drain portion with the adjacent anti-fuse structure. A top plate of the anti-fuse structures is embedded in the isolation structure which separates the transistors in the adjacent active regions, such that a pair of the anti-fuse structures has the same top plate. A dielectric layer of the anti-fuse structures is the isolation structure which is interposed between the top plate and the shared source/drain portion. Therefore, the pair of anti-fuse structures can be blown out at the same time, which increase the anti-fuse blowing out efficiency. The semiconductor layout structure of the present disclosure includes a plurality of unit cells having one transistor and one anti-fuse structure. Since the top plate of the anti-fuse structures is formed embedded in the isolation structure, the size of the unit cell can be decrease, thereby achieving a high device density.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor layout structure, comprising:
    a substrate comprising a plurality of active regions extending along a first direction, wherein adjacent active regions are separated from each other by an isolation structure;
    a plurality of gate structures extending across the plurality of active regions along a second direction that is perpendicular to the first direction, wherein each of the active regions comprises a pair of source/drain portions at opposite sides of each of a corresponding gate structure; and
    a plurality of conductive structures, each conductive structure is embedded in a first portion of a corresponding isolation structure disposed between adjacent active regions in the first direction, and has a bottom surface that is above bottom surfaces of adjacent pair of source/drain portions and a top surface leveled with top surfaces of the gate structures, wherein the conductive structure extends along the second direction and is separated from the adjacent source/drain portions by the isolation structure, wherein
    each conductive structure, the corresponding isolation structure between the adjacent active regions, and the corresponding source/drain region adjacent thereof constitute an anti-fuse.

2. The semiconductor layout structure of claim 1, wherein the first portion of the isolation structure comprises:
    a lower isolation structure interposed between the adjacent active regions; and
    an upper isolation structure disposed on the lower isolation structure and extended into the adjacent active regions on opposite sides of the first portion of the isolation structure along the first direction.

3. The semiconductor layout structure of claim 2, wherein the conductive structure has a portion of a sidewall covered by the upper isolation structure.

4. The semiconductor layout structure of claim 1, wherein the first portion of the isolation structure has a width that is greater than a width of the conductive structure in the first direction.

5. The semiconductor layout structure of claim 1, wherein the isolation structure further comprises a second portion interposed between adjacent active regions in the second direction.

6. The semiconductor layout structure of claim 1, wherein a first gate structure and a second gate structure are disposed on each of the active regions, and each of the active regions has a common source/drain portion shared by the first gate structure and the second gate structure.

7. The semiconductor layout structure of claim 1, further comprising a plurality of contact plugs respectively connected to the plurality of conductive structures, the pair of source/drain portions, and the plurality of gate structures.

8. The semiconductor layout structure of claim 7, further comprising a plurality of connected lines extending along the first direction and connected to the gate structures via the contact plugs.

9. A semiconductor structure, comprising:
    a substrate having a first active region and a second active region spaced from each other;
    a first transistor and a second transistor respectively at least partially disposed in the first active region and the second active region, wherein each of the first transistor and the second transistor comprises a pair of source/drain portions in the substrate;
    an isolation structure interposed between the first transistor and the second transistor, wherein the isolation structure has a protruding portion laterally extended into the first active region and the second active region; and
    a conductive structure embedded in the isolation structure, wherein the conductive structure is separated from the first transistor and the second transistor by the protruding portion of the isolation structure and has a top surface leveled with top surfaces of the first and second transistors, and
    each of the source/drain portions has a bottom surface that is below a bottom surface of the conductive structure, wherein
    the conductive structure, source/drain portions of the first transistor and the second transistor adjacent to the conductive structure, and the isolation structure compose a pair of anti-fuse.

10. The semiconductor structure of claim 9, wherein the conductive structure has a portion of a sidewall covered by the protruding portion of the isolation structure.

11. The semiconductor structure of claim 9, wherein the isolation structure has a width that is greater than a width of the conductive structure.

12. The semiconductor structure of claim 9, wherein each of the first transistor and the second transistor comprises a gate structure on the substrate.

13. The semiconductor structure of claim 12, wherein the protruding portion of the isolation structure has a top surface that is leveled with a top surface of the source/drain portions.

14. The semiconductor structure of claim 12, further comprising a plurality of contact plugs respectively connected to the conductive structure, one of the source/drain portions away from the conductive structure, and the gate structure.

15. The semiconductor structure of claim 14, further comprising a connected line coupled to the gate structure.

* * * * *